United States Patent [19]

Johnson et al.

[11] Patent Number: 5,411,906
[45] Date of Patent: May 2, 1995

[54] METHOD OF FABRICATING AUXILIARY GATE LIGHTLY DOPED DRAIN (AGLDD) STRUCTURE WITH DIELECTRIC SIDEWALLS

[75] Inventors: Eric A. Johnson, San Jose; Ying T. Loh, Saratoga; Chung S. Wang, Fremont, all of Calif.

[73] Assignee: VLSI Technology, Inc., San Jose, Calif.

[21] Appl. No.: 100,638

[22] Filed: Jul. 30, 1993

Related U.S. Application Data

[63] Continuation of Ser. No. 786,193, Oct. 31, 1991, abandoned.

[51] Int. Cl.$^6$ .................................. H01L 21/336
[52] U.S. Cl. .................................. 437/44; 437/200; 257/344
[58] Field of Search .............. 437/40, 41, 44, 200, 437/233; 257/336, 344

[56] References Cited

U.S. PATENT DOCUMENTS

| | | | |
|---|---|---|---|
| 4,740,484 | 4/1988 | Norstrom et al. | 437/44 |
| 4,818,714 | 4/1989 | Haskell | 437/44 |
| 4,859,620 | 8/1989 | Wei et al. | 437/41 |
| 4,925,807 | 5/1990 | Yoshikawa | 437/44 |
| 4,971,922 | 11/1990 | Watabe et al. | 437/44 |
| 5,015,598 | 5/1991 | Verhaar | 437/41 |
| 5,119,152 | 6/1992 | Mizuno | 257/344 |
| 5,132,758 | 7/1992 | Minami et al. | 257/344 |

FOREIGN PATENT DOCUMENTS

| | | | |
|---|---|---|---|
| 0136022 | 6/1987 | Japan | 437/44 |
| 0155238 | 6/1990 | Japan | 437/44 |
| 0155239 | 6/1990 | Japan | 437/44 |

OTHER PUBLICATIONS

Ghandhi, *VLSI Fabrication Principles*, John Wiley & Sons, 1983, pp. 353–354.

J. E. Moon, et al., "A New LDD Structure: Total Overlap with Polysilicon Spacer (TOPS)", IEEE Electronic Device Letters, May 1990, pp. 221–223.

T. Y. Huang: "A novel SubMicron LDD Transistor with Inverse-T Gate Structure", IEDM, 1986, pp. 742–745.

R. Izawa, et al., "The Impact of Gate-Drain Overlapped LDD(GOLD) For Deep SubMicron LVSIs", IEDM 1987, pp. 38–41.

M. Minami, Y. Sawahata, H. Matsuki and T. Naganoi, "A High Speed and High Reliability MOSFET utilizing an Auxillary Gate", 1990 Symposium on LVSI Technology, pp. 41–42.

I. C. Chen, J. P. Lin, and C. W. Teng, "A Highly Reliable 0.3 μm N-channel MOSFET Using Poly Spacers", 1990 Symposium on VLSI Technology, pp. 39–40.

*Primary Examiner*—Mary Wilczewski
*Attorney, Agent, or Firm*—Douglas L. Weller

[57] ABSTRACT

In a method for producing an auxiliary gate lightly doped drain structure, a gate region is placed on a substrate between two source/drain regions. A first implant of atoms is made into the substrate on two sides of the gate region. Sidewalls are formed on the two sides of the gate region. Auxiliary gate regions are formed over the sidewalls. The auxiliary gate regions are separated from the gate region by the sidewalls. Dielectric regions are formed over the auxiliary gate regions. A second implant of atoms is performed into the substrate on two sides of the dielectric regions. The sidewalls and the auxiliary gate regions are composed of resistive material.

12 Claims, 5 Drawing Sheets

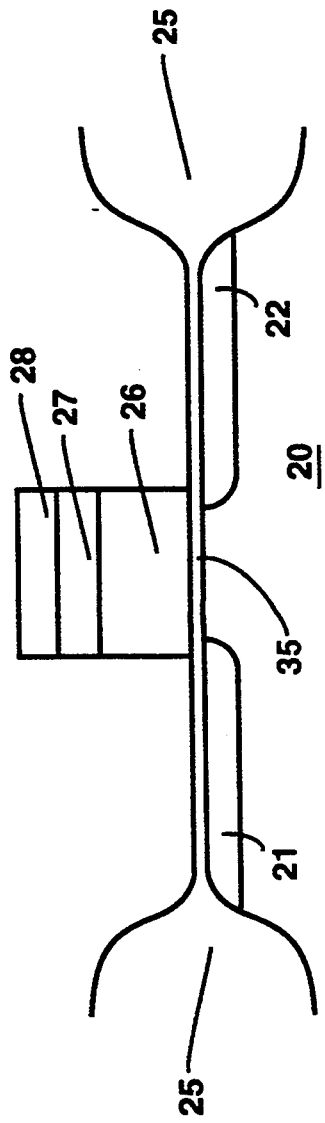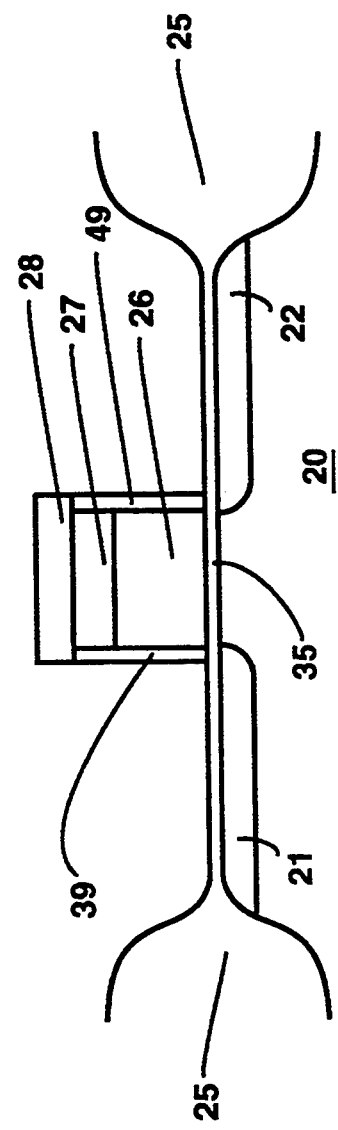

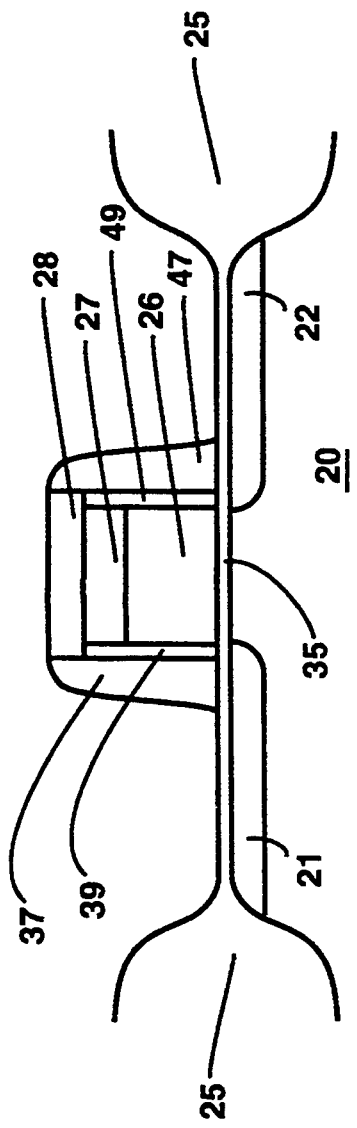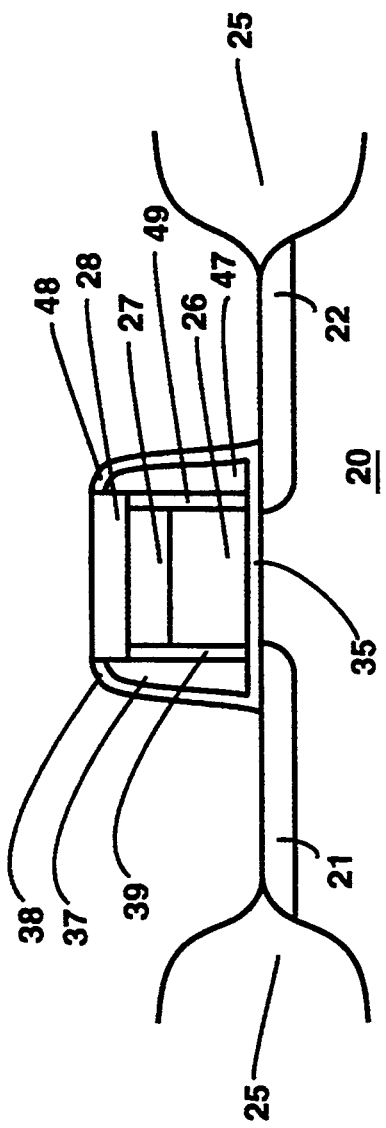

METHOD OF FABRICATING AUXILIARY GATE LIGHTLY DOPED DRAIN (AGLDD) STRUCTURE WITH DIELECTRIC SIDEWALLS

CROSS REFERENCE TO RELATED APPLICATION

This application is a continuation of application Ser. No. 07/786,193, filed Oct. 31, 1991, now abandoned.

BACKGROUND

The present invention concerns an auxiliary gate lightly doped drain (AGLDD) process for use in producing high reliability submicron metal oxide silicon field effect transistors (MOSFETs).

The use of gate overlapped lightly doped drain (GOLDD) processes to increase reliability of high speed submicron MOSFETs has been investigated. For example, in one process, referred to as total overlap with polysilicon spacer (TOPS), three deposits of polysilicon are use to form a gate region of a transistor which overlaps the source and drain region of the transistor. See J. E. Moon, et al., *A New LDD Structure: Total Overlap with Polysilicon Spacer (TOPS)*, IEEE Electronic Device Letters, May 1990, pp. 221–223. See also T. Y Huang: *A novel SubMicron LDD Transistor with inverse-T Gate Structure*, IEDM, 1986, pp. 742–745, and R. Izawa, et. al., The *Impact of Gate-Drain overlapped LDD(GOLD)/For Deep SubMicron VLSIs*, IEDM 1987, pp. 38–41.

However, in such GOLDD structures gate-drain overlap capacitance and gate-source overlap capacitance can result in slow circuit operation speed. In order to reduce gate-drain overlap capacitance and gate-source overlap capacitance, AGLDD processes have been suggested. See for example, Matsatka Minami, Yasuo Sawahata, Hiroshi Matsuki and Takahiro Naganoi, *A High Speed and High Reliability MOSFET utilizing an Auxiliary Gate*, 1990 Symposium on VLSI Technology, pp. 41–42; and I. C. Chen, J. P. Lin, and C. W. Teng, *A Highly Reliable 0.3 $\mu$m N-channel MOSFET Using Poly Spacers*, 1990 Symposium on VLSI Technology, pp. 39–40.

In the above-cited AGLDD processes, an auxiliary resistor is inserted between the auxiliary and main gates. The value of the auxiliary resistance is selected so that the RC time constant of the auxiliary resistance and the gate-source/drain overlap capacitance is longer than the circuit delay time. This prevents transient circuit action from being affected by the gate-source/drain overlap capacitance. In DC circuit action, however, the auxiliary gate works to increase the high hot-carrier reliability of the circuit.

One drawback of the above-cited prior art AGLDD process described by Matsatka Minami, Yasuo Sawahata, Hiroshi Matsuki and Takahiro Naganoi, *High Speed and High Reliability MOSFET utilizing an Auxiliary Gate*, 1990 Symposium on VLSI Technology, pp. 41–42, is that the value of the auxiliary resistance is dependent upon a layer of oxide on the sides of the main gate. This oxide layer thickness, however, is difficult to control in a manufacturing environment.

SUMMARY OF THE INVENTION

In accordance with the preferred embodiment of the present invention, a method is presented for producing an auxiliary gate lightly doped drain structure. A gate region is placed on a substrate between two source/drain regions. The gate region may be composed entirely of polysilicon. Alternately, the gate region may include a metal-silicide gate region placed over a polysilicon gate region. The polysilicon is doped with, for example, Phosphorus or Arsenic. In the preferred embodiment, an insulator region is placed on top of the gate region. The insulator region may be composed of, for example, nitride or oxide.

A first implant of atoms is made into the substrate on two sides of the gate region. For example, the implanted atoms may be of Phosphorus, Arsenic or Boron depending upon the conductivity type and concentration of atoms implanted. Sidewalls are formed on the two sides of the gate region. For example, the sidewalls may be formed of thermal oxide. First portions of the sidewalls immediately adjacent to the polysilicon gate region act as a resistor. This results, for example, from Phosphorus doping out diffusing from the polysilicon gate region.

Auxiliary gate regions are formed over the sidewalls. For example, the auxiliary gate regions may be formed of lightly doped polysilicon. Alternately the auxiliary gate regions may be formed of intrinsic polysilicon. The auxiliary gate regions are separated from the gate region by the sidewalls. Dielectric regions are formed over the auxiliary gate regions. A second implant of atoms is performed into the substrate on two sides of the dielectric regions.

The structure resulting from the present invention is advantageous over the prior are in that the auxiliary resistance has two components: resistance through the sidewalls and resistance through the auxiliary gate. The resistance through the sidewalls may be varied by varying thickness of the sidewalls. Additionally, the resistance through the sidewalls may be varied by varying the height of the polysilicon gate region and the metal-silicide gate region. This is because, there is no out-diffusing of, for example, Phosphorus atoms from the metal-silicide gate region. The portions of the sidewalls immediately adjacent to the metal-silicide gate region, therefore, act as insulators. Thus, decreasing the height of the polysilicon gate region increases total resistance through the sidewalls.

Resistance through the auxiliary gate may be increased or decreased by varying the dopant concentration of polysilicon used to implement the auxiliary gate. Additionally, the thickness of the dielectric regions formed over the auxiliary gate may be varied, so that the second implant of atoms modulates resistance of the auxiliary gate regions.

The present invention is further improved over the prior art in that in a manufacturing environment, the value of the auxiliary resistance can be controlled sufficiently to insure that gate-source/drain overlap capacitance is negligible at transient circuit operation.

BRIEF DESCRIPTION OF THE DRAWINGS

FIG. 3 through FIG. 7 illustrate a method for producing an auxiliary gate lightly doped drain structure in accordance with the preferred embodiment of the present invention.

DESCRIPTION OF THE PRIOR ART

Figure 1:
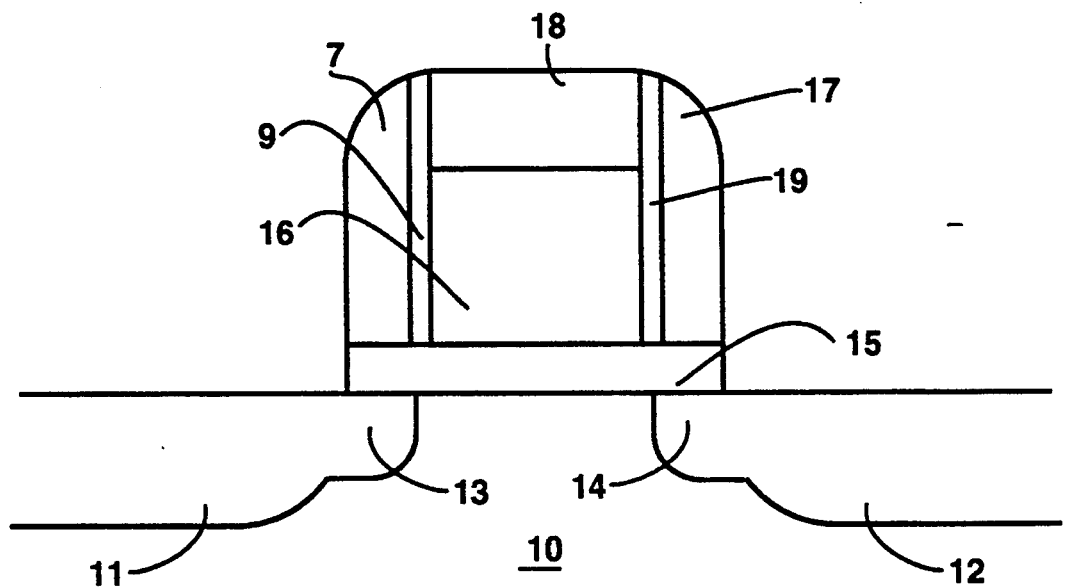
FIG. 1 illustrates a prior art auxiliary gate lightly doped drain process.

FIG. 1 shows a structure resulting from a prior art AGLDD process. Within a well 10 of a substrate is implanted an n+ region 11, an n+ region 12, an n− region 13 and an n− region 14. A main gate region 16 is placed on top of a gate oxide layer 15. Gate oxide layer 15 is on top of substrate 10. On top of main gate region 16 is an oxide region 18. Main gate region 16 is surrounded on two sides by an oxide region 9 and an oxide region 19 which each function as a resistor. Separated from main gate region 16 by oxide region 9 is an auxiliary gate 7. Separated from main gate region 16 by oxide region 19 is an auxiliary gate 17.

Figure 2:
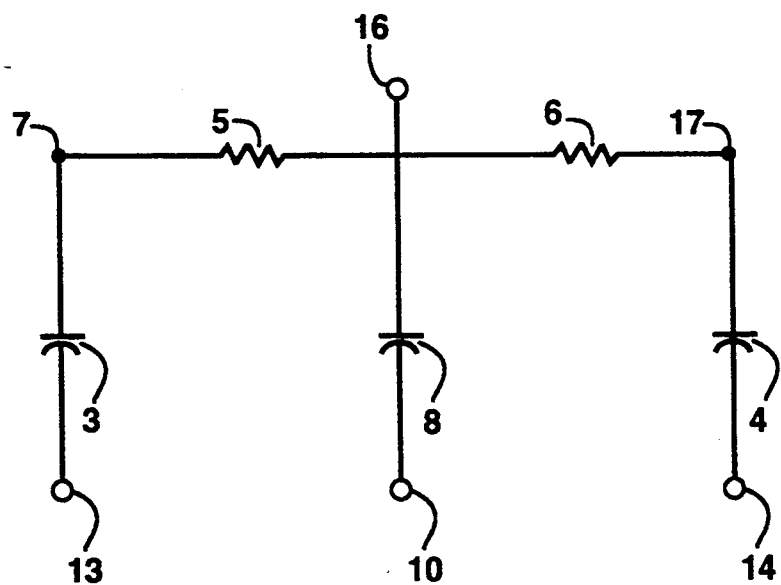
FIG. 2 shows an equivalent circuit for a structure formed by the prior art auxiliary gate lightly doped drain process illustrated in FIG. 1.

FIG. 2 shows an equivalent circuit for the structure shown in FIG. 1. A capacitance 8 represents gate capacitance across gate oxide region 15. Capacitance 3 represents the gate-source/drain overlap capacitance between auxiliary gate 17 and source/drain region 13. Capacitance 4 represents the gate-source/drain overlap capacitance between auxiliary gate 17 and source/drain region 14. A resistor 5 represents auxiliary resistance through oxide region 9. A resistor 6 represents auxiliary resistance through oxide region 19. An auxiliary gate RC time constant may be calculated by multiplying the auxiliary resistance 5 by the gate-source/drain overlap capacitance 3 or by multiplying the auxiliary resistance 6 by the gate-source/drain overlap capacitance 4.

The width of oxide region 9 and the width of oxide region 19, and thus the value of the auxiliary resistance, is selected so that the RC time constant is longer than the circuit delay time. This prevents transient circuit action from being affected by gate-source/drain overlap capacitance 3 and gate-source/drain overlap capacitance 4. In DC circuit action, however, the auxiliary gate works to increase the high hot-carrier reliability of the circuit.

One drawback of the above-described AGLDD process is that the value of the auxiliary resistance 5 and the value of the auxiliary resistance 6 are dependent upon the thickness of oxide region 9 and Oxide region 19, respectively. However, in a manufacturing environment, the thickness of oxide region 9 and oxide region 19 is difficult to control.

DESCRIPTION OF THE PREFERRED EMBODIMENT

FIG. 3 through FIG. 7 illustrate a method for producing a gate overlapped lightly doped drain MOSFET in accordance with a preferred embodiment of the present invention.

The structure shown in FIG. 3 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is thermally grown. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A first gate region 26 is formed on gate oxide layer 35 using a mask and etch process. Typically, first gate region 26 has a width which is less than or equal to 0.8 microns. First gate region 26 may be made of polysilicon, for example, doped with n-type atoms at $10^{20}$ atoms per cubic centimeter. The n-type atoms may be, for example, Phosphorus or Arsenic. While the gate may be formed entirely of polysilicon, in the preferred embodiment of the present invention the gate is a polycide. A second gate region 27 of metal-silicide is formed on first gate region 26. A cap oxide region 28 is formed on top of second gate region 27. A typical thickness for polysilicon region 26 is 0.2 microns. A typical thickness for metal-silicide region 27 is 0.2 microns. A typical thickness for cap oxide region 28 is 0.1 microns. In the preferred embodiment, Titanium (Ti) is used to form the metal-silicide layer. Other metals may be used such as, for example, Molybdenum (Mo), Chromium (Cr), Nickel (Ni), Platinum (Pt), Cobalt (Co), Tungsten (W) or Tantalum (Ta).

The gate regions may be formed as follows. A layer of polysilicon is deposited over the layer of gate oxide 35. For example, the deposition may be a chemical vapor deposition (CVD). The polysilicon is doped using $POCl_3$. Alternately, an implant of Phosphorus or Arsenic atoms may be used. A metal layer is deposited on top of the polysilicon layer. A rapid thermal anneal (or other annealing process) is used to react the metal layer with the polysilicon layer. On top of the resulting metal-silicide layer region there is placed a dielectric layer. The dielectric layer may be placed, for example, using chemical vapor deposition (CVD) of oxide. Using a mask, an etch is performed on both sides of region 26, 27 and 28. The mask and etch exposes the gate oxide layer on top of the substrate.

On the sides of gate region 26 and gate region 27 are implanted a region 21 and a region 22 of second conductivity type. Region 21 and region 22 act as source/drain regions for a transistor. For example, region 21 and region 22 are n− regions doped with Phosphorus at $10^{17}$ atoms per cubic centimeter. Region 21 and region 22 extend 0.1 microns below the surface of the substrate. Alternately, region 21 and region 22 may be p− regions. Region 21 is separated from region 22 by, for example, 0.8 microns or less. The resulting structure is shown in FIG. 3.

A sidewall region 39 and a sidewall region 49 are formed on both sides of the gate. Sidewall region 39 and sidewall region 49 are formed, for example, by thermal oxidation of the gate regions. For example, sidewall region 39 and sidewall region 49 are typically 40 Å to 100 Å thick and are thermally grown, for example, heating the structure for ten minutes at 900 degrees Celsius. Portions of sidewall region 39 and sidewall region 49 immediately adjacent to polysilicon gate region 26 will be doped with Phosphorus through out diffusion from polysilicon gate region 26. This out diffusion will make those sidewall portions resistive. Portions of sidewall region 39 and sidewall region 49 immediately adjacent to metal-silicide region 27 will not be doped and thus will function as insulators. FIG. 4 shows the structure after the forming of sidewall region 39 and sidewall region 49.

An auxiliary gate region 37 and an auxiliary gate region 47 are formed as shown in FIG. 5. Auxiliary gate region 37 and auxiliary gate region 47 may be formed, for example, by deposition of intrinsic or lightly doped polysilicon at $10^{15}$ atoms per cubic centimeter. Alternately, another semiconducting material may be used. The polysilicon is then etched back until auxiliary gate region 37 and auxiliary gate region 47 are formed. For a desired width of 0.15 microns for auxiliary gate region 37 and auxiliary gate region 47, the lightly doped polysilicon layer may be approximately 0.2 microns.

As shown in FIG. 6, a sidewall dielectric region 38 and a sidewall dielectric region 48 are formed over auxiliary gate region 37 and auxiliary gate region 47, respectively. Sidewall dielectric 38 and sidewall dielectric region 48 may be formed, for example, by chemical vapor deposition (CVD) of oxide, and then etch back. The etch back removes any remaining exposed portions of gate oxide layer 35. Sidewall dielectric region 38 and sidewall dielectric region 48 are formed to shield against penetration of n-type atoms or p-type atoms during the following implant of either n+ or p+ regions. For example, sidewall dielectric region 38 and sidewall dielectric region 48 may be constructed by the formation of a 0.2 micron thick layer of CVD deposited oxide, CVD deposited nitride, or some other dielectric which is able to protect auxiliary gate 37 and auxiliary gate 47 during an n+ source/drain implant or a p+ source/drain implant. Alternately the thickness of sidewall dielectric region 38 and sidewall dielectric region 48 may be selected so that the following implant of either n+ or p+ regions modulates the resistivity of auxiliary gate 37 and auxiliary gate 47.

Figure 9:
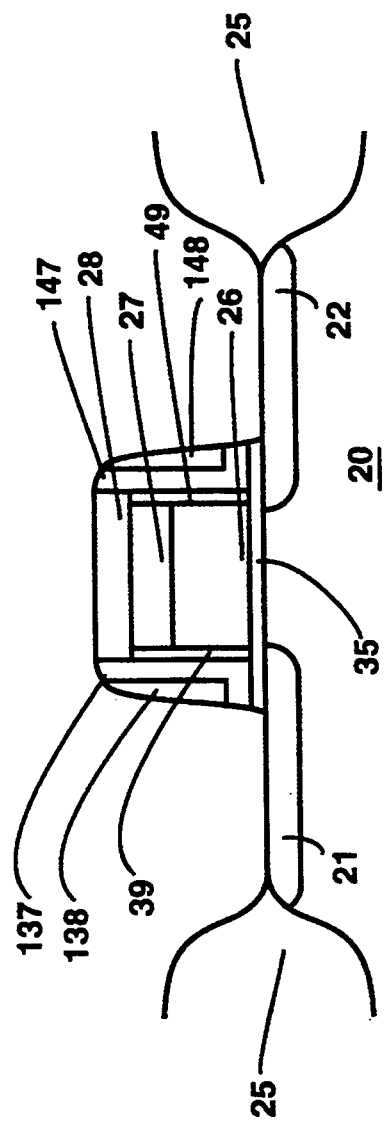
FIG. 9 illustrates an alternate embodiment of the structure shown in FIG. 6 formed in accordance with an alternate preferred embodiment of the present invention.

FIG. 9 illustrates an alternate embodiment to that shown in FIG. 6. In FIG. 9, a sidewall dielectric region 138, a sidewall dielectric region 148, an auxiliary gate region 137 and auxiliary gate region 147, are formed using sequential deposition followed by sequential etch back. To do so, a layer of intrinsic polysilicon and a layer of dielectric material are sequentially deposited, for example using sequential CVD processes. Then a sequential reactive ion etch back is performed on the dielectric layer and the polysilicon layer to produce sidewall dielectric region 138, sidewall dielectric region 148, auxiliary gate region 137 and auxiliary gate region 147.

Figure 7:
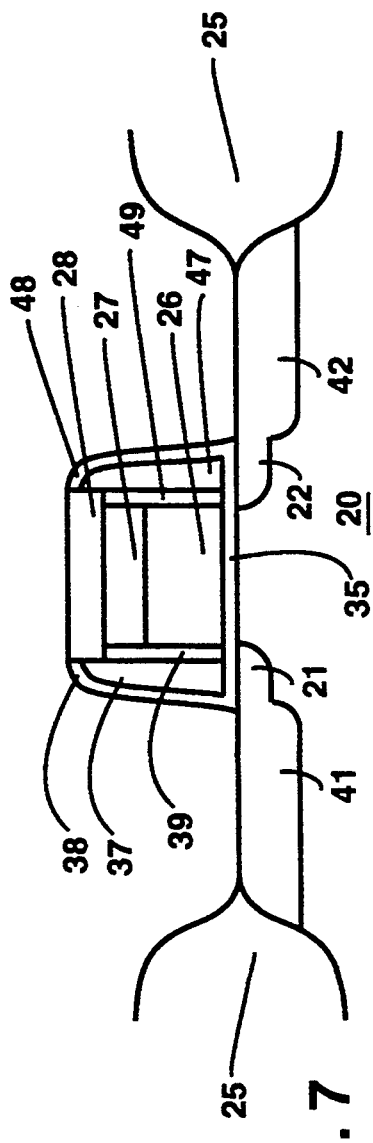

As shown in FIG. 7, a mask and implant is used to form a region 41 overlapping source/drain region 21 and a region 42 overlapping source/drain region 22. The implants may be performed, for example, using n-type atoms to form n+ regions having concentration of $10^{21}$ atoms per cubic centimeter. Alternately, the implant may use p-type atoms to form p+ regions. Sidewall dielectric region 38 and sidewall dielectric region 48 respectively shield auxiliary gate region 37 and auxiliary gate region 47 from the implant. Alternately, the thickness of sidewall dielectric region 38 and sidewall dielectric region 48 may be selected so that auxiliary gate region 37 and auxiliary gate region 47 are only partially shielded from the implant, thereby allowing the implant to modulate the resistivity of auxiliary gate region 37 and auxiliary gate region 47. A high temperature anneal is performed, for example at 900 degrees Celsius for 30 minutes, to activate doped atoms.

An insulating layer of a BPSG layer on top of a TEOS layer are deposited over the substrate. For example, the TEOS layer is 0.15 microns and the BPSG layer is 0.4 microns. The insulating layer is masked and etched to produce connection holes. A metal layer is then deposited in contact with source/drain region 41 and source/drain region 42 through the connection holes.

Figure 8:
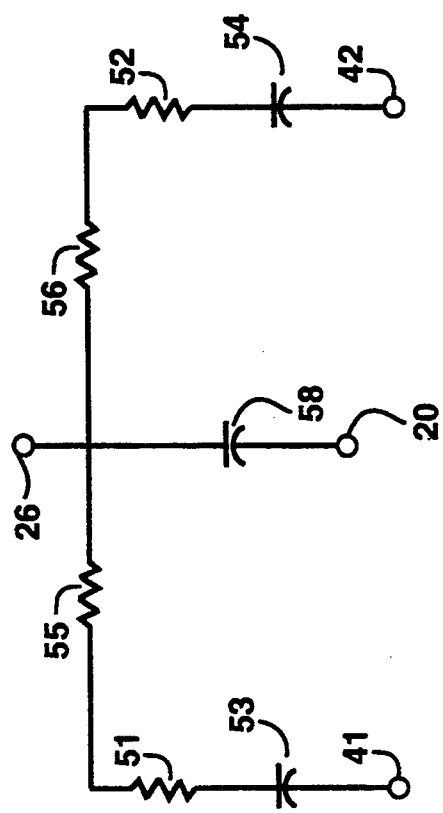
FIG. 8 shows an equivalent circuit for a structure formed by the auxiliary gate lightly doped drain process illustrated in FIG. 3 through FIG. 7 in accordance with the preferred embodiment of the present invention.

FIG. 8 shows an equivalent circuit for the structure shown in FIG. 7. A capacitance 58 represents gate capacitance from gate region 26 across gate oxide region 35 to well 20. Capacitance 53 represents the gate-source/drain overlap capacitance from auxiliary gate 37 across gate oxide region 35 to source/drain regions 21 and 41. Capacitance 54 represents the gate-source/drain overlap capacitance from auxiliary gate 47 across gate oxide region 35 to source/drain regions 22 and 42. A resistor 55 represents auxiliary resistance through sidewall region 39. A resistor 56 represents auxiliary resistance through sidewall region 49. A resistor 51 represents auxiliary resistance through auxiliary gate 37. A resistor 52 represents auxiliary resistance through auxiliary gate 47.

An auxiliary gate RC time constant may be calculated by multiplying the sum of auxiliary resistance 55 and auxiliary resistance 51 by the gate-source/drain overlap capacitance 53, or the auxiliary gate RC time constant may be calculated by multiplying the sum of auxiliary resistance 56 and auxiliary resistance 52 by the gate-source/drain overlap capacitance 54.

Resistance 55 and resistance 56 may be varied by the respective thickness of sidewall region 39 and sidewall region 49. Resistance 55 and resistance 56 may also be varied by the height of polysilicon gate region 26. This is because the portions of sidewall region 39 and sidewall 49 immediately adjacent to polysilicon gate region 26 will be doped with Phosphorus through out diffusion from polysilicon gate region 26. This out diffusion will make those sidewall portions resistive. Portions of sidewall region 39 and sidewall 49 immediately adjacent to metal-silicide region 27 will not be doped and thus will function as insulators. Therefore, the greater the height of polysilicon gate region 26, the larger the area through which electrons may pass between gate region 26 and auxiliary gate 37 and auxiliary gate 47, and thus the lesser the resistance of resistor 55 and resistor 56.

The resistance of resistor 51 and resistor 52 may be adjusted by varying the choice of intrinsic polysilicon or lightly doped polysilicon. The resistance of resistor 51 and resistor 52 may also be adjusted by respectively varying the thickness of sidewall dielectric region 38 and sidewall dielectric region 48 so that sidewall dielectric region 38 and sidewall dielectric region 48 to a greater or lesser degree shield against penetration of n-type atoms or p-type atoms during the following implant of either n+ regions or p+ regions. The greater the amount of n-type or p-type atoms which are allowed to penetrate through sidewall dielectric region 38 and sidewall dielectric region 48, the greater the conductivity through auxiliary gate 37 and auxiliary gate 47.

The present invention is advantageous over the prior art processes in that there are several ways to vary the auxiliary gate RC time constant. Further, the auxiliary gate RC time constant can be adequately controlled in a manufacturing environment.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing an auxiliary gate lightly doped drain structure, the method comprising the steps of:
   (a) placing on a substrate between two source/drain regions, a polysilicon gate region, the polysilicon gate region being placed on top of a dielectric layer, the polysilicon gate region forming part of a gate region;
   (b) placing on the polysilicon gate region, a metal-silicide gate region, the metal-silicide gate region forming part of the gate region;
   (c) performing a first implant of atoms into the substrate on two sides of the gate region;
   (d) forming sidewalls on the two sides of the gate region, first portions of the sidewalls immediately adjacent to the metal-silicide gate region acting as insulators and second portions of the sidewalls immediately adjacent to the polysilicon gate region acting as resistors;
   (e) forming auxiliary gate regions over the sidewalls formed in step (d), so that an auxiliary resistance from the gate region to the auxiliary gate regions is increased by decreasing a height of the polysilicon gate region and so that the auxiliary resistance from the gate region to the auxiliary gate regions is decreased by increasing a height of the polysilicon gate region, wherein the auxiliary gate regions consist of semiconducting material;
   (f) forming dielectric regions over the auxiliary gate regions formed in step (e); and,
   (g) performing a second implant of atoms into the substrate on two sides of the dielectric regions formed in step (f);
   wherein in step (f) the dielectric regions are formed at a thickness sufficient to at least partially shield the auxiliary gate regions from the second implant of atoms performed in step (g).

2. A method as in claim 1 wherein after step (b) an oxide region is placed over the metal-silicide gate region.

3. A method as in claim 1 wherein after step (b) an nitride region is placed over the metal-silicide gate region.

4. A method as in claim 1 wherein step (a) includes doping the polysilicon gate region with Phosphorus.

5. A method as in claim 1 wherein step (a) includes doping the polysilicon gate region with Arsenic.

6. A method as in claim 1 wherein the auxiliary gate regions formed in step (e) are lightly doped polysilicon.

7. A method as in claim 1 wherein the sidewalls formed in step (d) are Phosphorus doped thermal oxide.

8. A method as in claim 1 wherein the dielectric regions formed in step (f) are sufficiently thin so that the second implant of atoms in step (g) modulates resistance of the auxiliary gate regions formed in step (e), and wherein the dielectric regions formed in step (f) are sufficiently thick so that after the second implant of atoms performed in step (g), the auxiliary gate regions formed in step (e) act as resistors.

9. A method for producing an auxiliary gate lightly doped drain structure, the method comprising the steps off
   (a) placing on a substrate between two source/drain regions, a polysilicon gate region, the polysilicon gate region being placed on top of a dielectric layer;
   (b) performing a first implant of atoms into the substrate on two sides of the polysilicon gate region;
   (c) forming sidewalls on the two sides of the gate polysilicon region, first portions of the sidewalls immediately adjacent to the polysilicon gate region acting as resistors;
   (d) forming auxiliary gate regions over the sidewalls formed in step (c), the auxiliary gate regions comprising semiconducting material;
   (e) forming dielectric regions over the auxiliary gate regions formed in step (d); and,
   (f) performing a second implant of atoms into the substrate on two sides of the dielectric regions formed in step (e);
   wherein the dielectric regions are formed in step (e) at a thickness sufficient to partially, but not completely, shield the auxiliary gate regions from the second implant of atoms formed in step (f) so that after the second implant of atoms performed in step (f), auxiliary gate regions formed in step (d) act as resistors.

10. A method as in claim 9 wherein the auxiliary gate regions formed in step (d) are lightly doped polysilicon.

11. A method as in claim 9 wherein the sidewalls formed in step (c) are Phosphorus doped thermal oxide.

12. A method as in claim 9 wherein the dielectric regions formed in step (e) are sufficiently thin so that the second implant of atoms in step (f) modulates resistance of the auxiliary gate regions formed in step (d).

* * * * *